(12) United States Patent
Hudson et al.

(10) Patent No.: US 11,171,011 B2
(45) Date of Patent: Nov. 9, 2021

(54) METHOD FOR ETCHING AN ETCH LAYER

(71) Applicant: Lam Research Corporation, Fremont, CA (US)

(72) Inventors: Eric Hudson, Berkeley, CA (US); Kalman Pelhos, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 215 days.

(21) Appl. No.: 16/107,752

(22) Filed: Aug. 21, 2018

(65) Prior Publication Data
US 2020/0066540 A1 Feb. 27, 2020

(51) Int. Cl.
*H01L 21/311* (2006.01)
*H01L 21/3065* (2006.01)
*H01J 37/32* (2006.01)

(52) U.S. Cl.
CPC ... *H01L 21/31116* (2013.01); *H01J 37/32449* (2013.01); *H01J 2237/334* (2013.01)

(58) Field of Classification Search
CPC .............. H01L 21/30655; H01L 21/31116
See application file for complete search history.

(56) References Cited

U.S. PATENT DOCUMENTS

| 9,384,998 B2 | 7/2016 | Hudson et al. | |
| 2012/0108079 A1* | 5/2012 | Mahajani | C23C 16/45531 438/788 |
| 2016/0268141 A1 | 9/2016 | Hudson | |
| 2016/0343580 A1* | 11/2016 | Hudson | H01J 37/32091 |
| 2017/0076945 A1* | 3/2017 | Hudson | H01J 37/32908 |
| 2017/0178920 A1 | 6/2017 | Dole et al. | |

FOREIGN PATENT DOCUMENTS

| JP | 2013-21192 | 1/2013 |
| JP | 2013-229351 | 11/2013 |
| KR | 10-2017-0092645 | 8/2017 |
| KR | 10-2017-0132671 | 12/2017 |

OTHER PUBLICATIONS

International Search Report and Written Opinion from International Application No. PCT/US2019/042560 dated Nov. 8, 2019.

* cited by examiner

*Primary Examiner* — Thomas T Pham
(74) *Attorney, Agent, or Firm* — Beyer Law Group LLP (57) ABSTRACT

A method of forming a feature in a stack comprising a dielectric material on a substrate is provided. An etch plasma is generated from an etch gas, exposing the stack to the etch plasma and partially etching the feature in the stack. The stack is primed. A protective film is deposited on sidewalls of the feature by repeating for a plurality of cycles the steps of exposing the stack to a first reactant, allowing the first reactant to adsorb onto the stack, and exposing the stack to a second reactant, wherein the first and second reactants react with one another to form the protective film over the stack. The etching, priming, and depositing a protective film are repeated until the feature is etched to a final depth.

27 Claims, 6 Drawing Sheets

METHOD FOR ETCHING AN ETCH LAYER

BACKGROUND

Field

The disclosure relates to methods of forming semiconductor devices on a semiconductor wafer. More specifically, the disclosure relates to etching recessed features in an etch layer in a stack.

In forming semiconductor devices, etch layers may be etched to form memory holes or lines. Some semiconductor devices may be formed by etching a stack of bilayers of silicon oxide and silicon nitride (ONON). Such stacks may be used in memory applications, such as in forming dynamic random access memory (DRAM) and three dimensional "negative and" gates (3D NAND). In the formation of such memory structures, plasma processing chambers may be used to etch such memory structures.

SUMMARY

To achieve the foregoing and in accordance with the purpose of the present disclosure, a method of forming a feature in a stack comprising a dielectric material on a substrate is provided. An etch plasma is generated from an etch gas, exposing the stack to the etch plasma to partially etch the feature in the stack. The stack is primed. A protective film is deposited on sidewalls of the feature by repeating for a plurality of cycles the steps of exposing the stack to a first reactant, allowing the first reactant to adsorb onto the stack, and exposing the stack to a second reactant, wherein the first and second reactants react with one another to form the protective film over the stack. The etching, priming, and depositing a protective film are repeated until the feature is etched to a final depth.

In another manifestation, a method of forming a feature in a stack comprising a dielectric material on a substrate is provided. An etch plasma is generated from an etch gas, exposing the stack to the etch plasma and partially etching the feature in the stack. A protective film is deposited on sidewalls of the feature by repeating for a plurality of cycles the steps of exposing the stack to a first reactant, allowing the first reactant to adsorb onto the stack, and exposing the stack to a second reactant, wherein the first and second reactants react with one another to form the protective film over the stack. The protective film is cured. The steps are repeated until the feature is etched to a final depth.

In another manifestation, a method of forming a feature in a stack comprising a dielectric material on a substrate is provided. An etch plasma is generated from an etch gas, exposing the stack to the etch plasma and partially etching the feature in the stack. A protective film is deposited on sidewalls of the feature by performing a plurality of cycles, wherein each cycle comprises exposing the stack to a first reactant, allowing the first reactant to adsorb onto the stack, and exposing the stack to a second reactant, wherein the first and second reactants react with one another to form the protective film over the stack, wherein the protective film comprises at least one of a metal, sulfur, boron, silicon, nitrogen, or phosphorous. The process is repeated until the feature is etched to a final depth.

In another manifestation, a method of forming a feature in a stack comprising a dielectric material on a substrate is provided. An etch plasma is generated from an etch gas, exposing the stack to the etch plasma and partially etching the feature in the stack. A protective film is deposited on sidewalls of the feature by performing a plurality of cycles, wherein each cycle comprises exposing the stack to a first reactant, allowing the first reactant to adsorb onto the stack, and exposing the stack to a second reactant, wherein the first and second reactants react with one another to form the protective film over the stack. A breakthrough etch is provided, which etches protective film on etch fronts and/or at neck locations. The process is repeated until the feature is etched to a final depth.

In another manifestation, a method of forming a feature in a stack comprising a dielectric material on a substrate is provided. An etch plasma is generated from an etch gas, exposing the stack to the etch plasma and partially etching the feature in the stack, while cooling the substrate with a coolant cooled in a chiller to a temperature below $-20°$ C. A protective film is deposited on sidewalls of the feature at a temperature of at least $20°$ C. by performing a plurality of cycles, wherein each cycle comprises exposing the stack to a first reactant, allowing the first reactant to adsorb onto the stack, and exposing the stack to a second reactant, wherein the first and second reactants react with one another to form the protective film over the stack. The process is repeated until the feature is etched to a final depth.

These and other features of the present disclosure will be described in more details below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE EMBODIMENTS

The present disclosure will now be described in detail with reference to a few exemplary embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
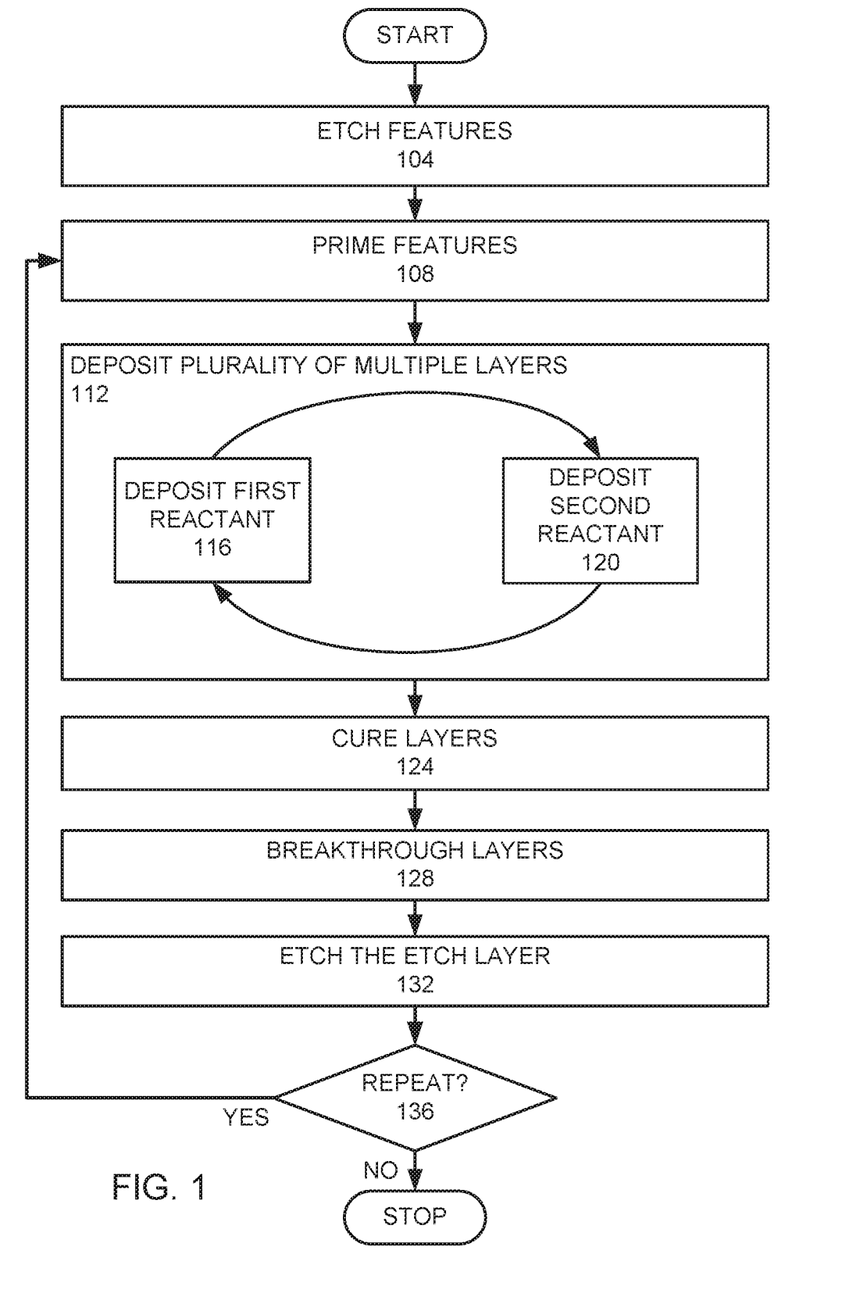
FIG. 1 is a high level flow chart of an embodiment.

FIG. 1 is a high level flow chart of an embodiment. In this embodiment, features are partially etched into an etch layer (step 104). The partially etched features are primed (step 108). A plurality of multiple layers is deposited (step 112), providing a protective film. The depositing of the multiple layers (step 112) comprises a cyclical process, where each cycle comprises depositing a first reactant (step 116) and depositing a second reactant (step 120). The deposited multiple layers are cured (step 124). A breakthrough etch is provided to etch the deposited multiple layers (step 128). The etch layer is partially etched (step 132). A determination is made on whether to continue the etch process (step 136). If the etch process is continued, steps 108 to 132 are repeated. When the etch is complete, the process is stopped.

Example

Figure 2:
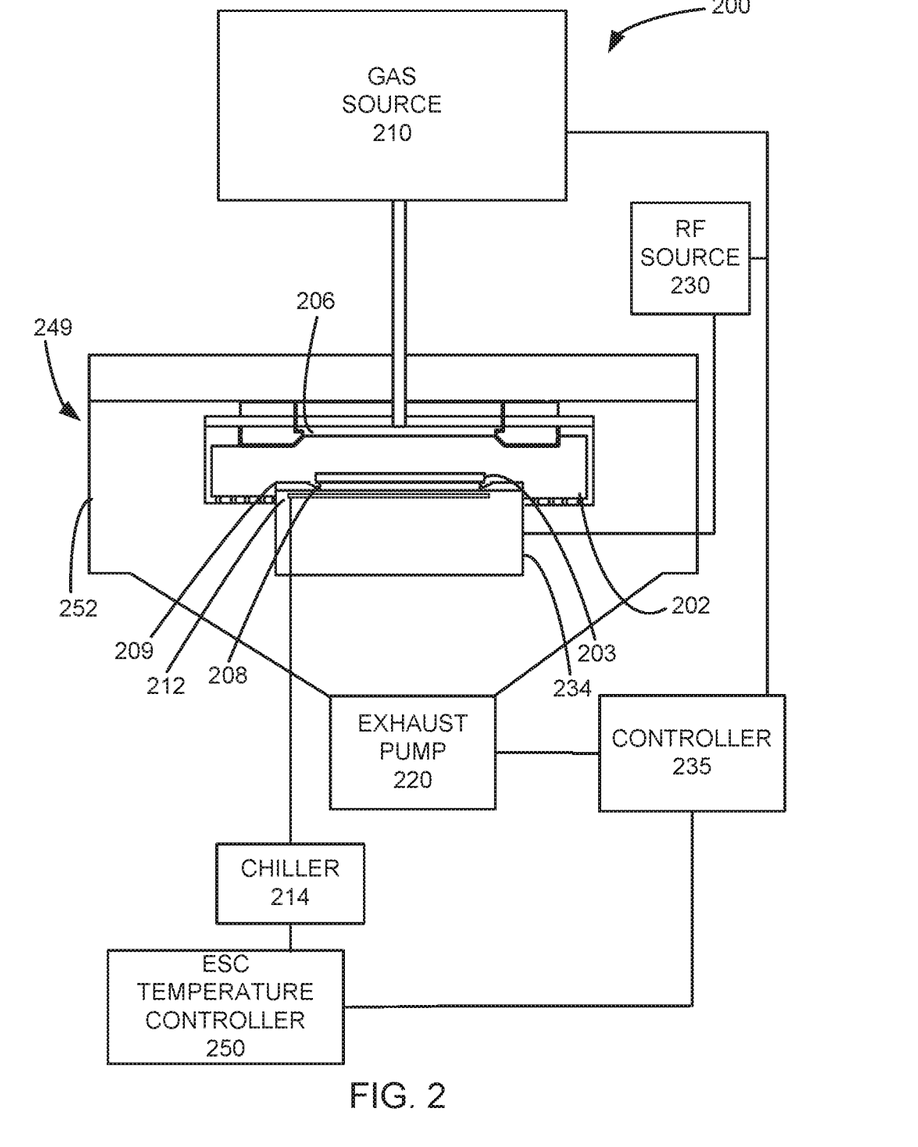
FIG. 2 is a schematic view of a etch chamber that may be used in an embodiment.

In an exemplary embodiment, FIG. 2 is a schematic view of an etch reactor that may be used in an embodiment. In one or more embodiments, a plasma processing chamber 200 comprises a gas distribution plate 206 providing a gas inlet and an electrostatic chuck (ESC) 208, within an etch chamber 249, enclosed by a chamber wall 252. Within the etch chamber 249, a stack 203 is positioned over the ESC 208. An edge ring 209 surrounds the ESC 208. An ESC temperature controller 250 is connected to a chiller 214. In this embodiment, the chiller 214 provides a coolant to channels 212 in or near the ESC 208. A radio frequency (RF) source 230 provides RF power to a lower electrode, which in this embodiment are the ESC 208. In an exemplary embodiment, 400 kHz and 60 MHz power sources make up the RF source 230. In this embodiment, the upper electrode is grounded. In this embodiment, one generator is provided for each frequency. Other arrangements of RF sources and electrodes may be used in other embodiments. A controller 235 is controllably connected to the RF source 230, an exhaust pump 220, and the etch gas source 210. An example of such an etch chamber is the Flex® etch system manufactured by Lam Research Corporation of Fremont, Calif. The process chamber can be a CCP (capacitive coupled plasma) reactor or an ICP (inductive coupled plasma) reactor.

Figure 3:
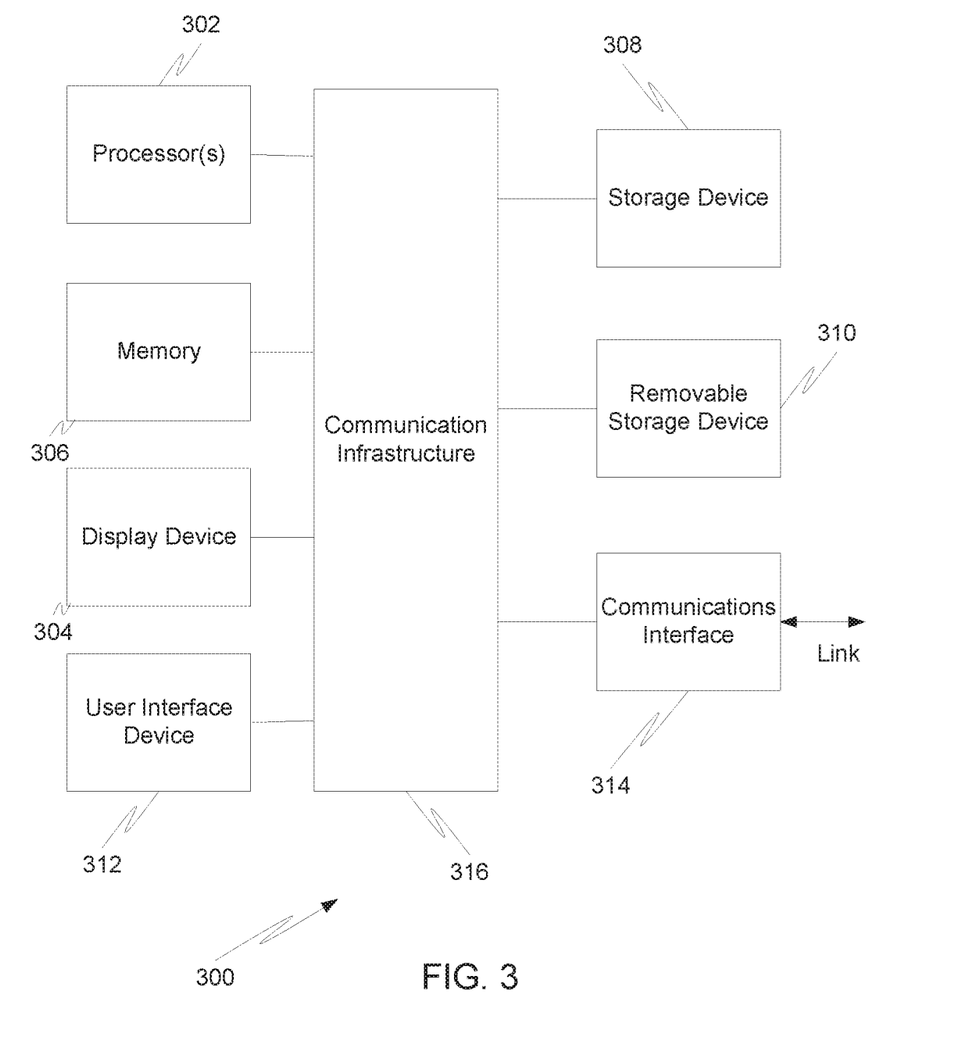
FIG. 3 is a schematic view of a computer system that may be used in practicing an embodiment.

FIG. 3 is a high level block diagram showing a computer system 300, which is suitable for implementing a controller 235 used in embodiments. The computer system may have many physical forms ranging from an integrated circuit, a printed circuit board, and a small handheld device up to a huge super computer. The computer system 300 includes one or more processors 302, and further can include an electronic display device 304 (for displaying graphics, text, and other data), a main memory 306 (e.g., random access memory (RAM)), storage device 308 (e.g., hard disk drive), removable storage device 310 (e.g., optical disk drive), user interface devices 312 (e.g., keyboards, touch screens, keypads, mice or other pointing devices, etc.), and a communication interface 314 (e.g., wireless network interface). The communication interface 314 allows software and data to be transferred between the computer system 300 and external devices via a link. The system may also include a communications infrastructure 316 (e.g., a communications bus, cross-over bar, or network) to which the aforementioned devices/modules are connected.

Information transferred via communications interface 314 may be in the form of signals such as electronic, electromagnetic, optical, or other signals capable of being received by communications interface 314, via a communication link that carries signals and may be implemented using wire or cable, fiber optics, a phone line, a cellular phone link, a radio frequency link, and/or other communication channels. With such a communications interface, it is contemplated that the one or more processors 302 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 4A:
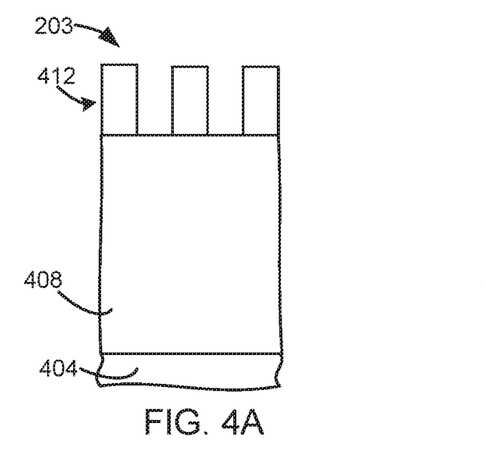
FIGS. 4A-G are schematic illustrations of a stack processed according to an embodiment.

FIG. 4A is a cross sectional view of a stack 203 with a substrate 404 disposed below an etch layer 408, disposed below a mask 412. In this example, the mask 412 is a hardmask, such as a plasma enhanced chemical vapor deposition (PECVD) carbon mask. In this example, the etch layer 408 is a dielectric layer, such as silicon oxide ($SiO_2$). One or more layers (not shown) may be disposed between the substrate 404 and the etch layer 408. One or more layers (not shown) may also be disposed between the etch layer 408 and the mask 412.

Figure 4B:
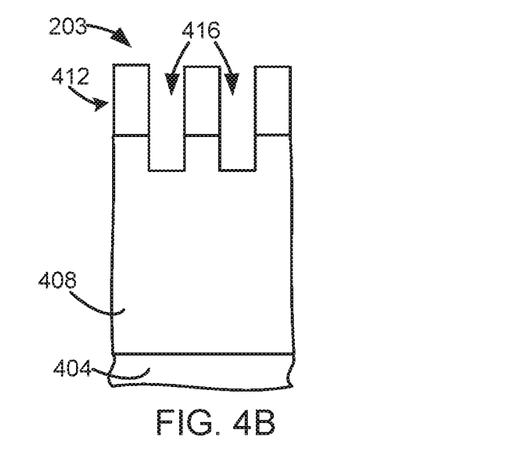

Features are partially etched into an etch layer 408 (step 104). In this embodiment, the stack 203 is cooled while remaining in the etch chamber 249. The chiller 214 cools a coolant to a temperature below −20° C. The coolant is used to cool the stack 203 and substrate. An example of a recipe for partially etching features into the etch layer 408 provides a pressure of 5-50 mT. RF power is provided at a frequency of 60 MHz at a power of 2 kW-8 kW and at a frequency of 400 k at a power of 4 kW-25 kW. The RF power is pulsed between these powers and lower power levels. An etch gas is provided, which comprises oxygen ($O_2$), fluorocarbon(s) and/or hydrofluorocarbon(s). The etch gas is formed into an etch plasma by the RF power. FIG. 4B is a cross sectional view of a stack 203 after features 416 have been partially etched.

Figure 4C:
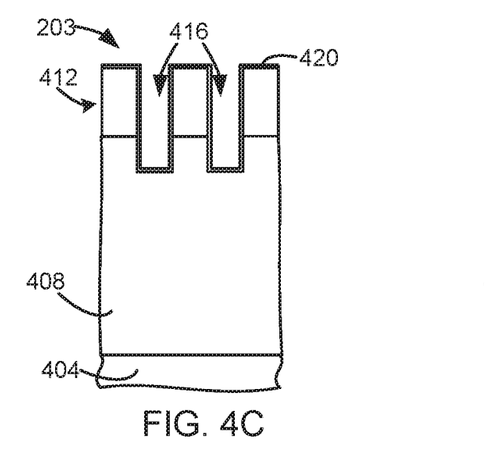

The features 416 are primed (step 108). An example in this embodiment provides the priming by exposing the features 416 to a low-power carbon dioxide ($CO_2$) plasma condition which modifies the surface chemical functionality. FIG. 4C is a cross sectional view of a stack 203 after features 416 have been primed creating a priming layer 420. The priming layer 420 is not drawn to scale to more clearly illustrate the priming layer 420.

Figure 4D:
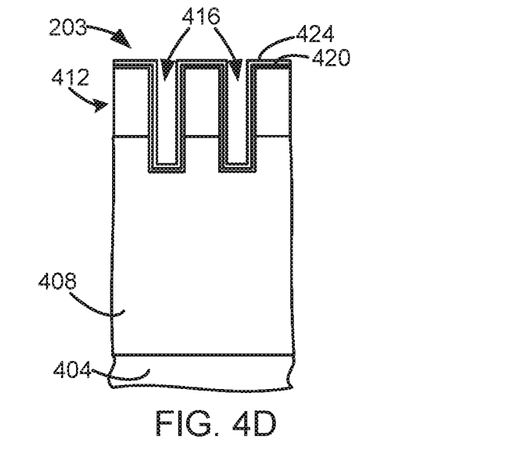
Figure 5:
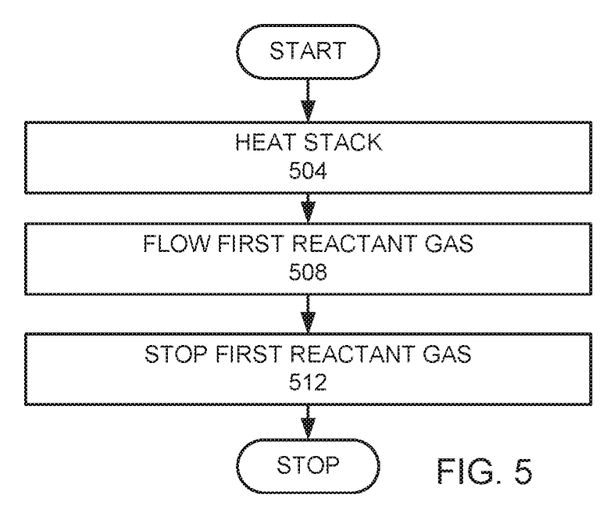
FIG. 5 is a more detailed flow chart of a process for depositing a first reactant.
Figure 6:
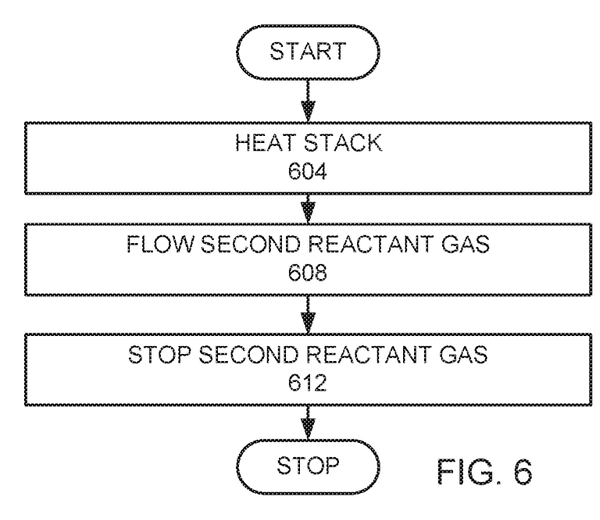
FIG. 6 is a more detailed flow chart of a process for depositing a second reactant.

A plurality of multiple layers is deposited (step 112). The depositing of the multiple layers (step 112) comprises a cyclical process with multiple cycles, where each cycle comprises depositing a first reactant (step 116) and depositing a second reactant (step 120). FIG. 5 is a more detailed flow chart of the depositing the first reactant (step 116). The stack 203 is heated (step 504). In this embodiment, the stack 203 is heated while remaining in the etch chamber 249. The ESC temperature controller may heat the ESC 208 to maintain the stack 203 at a temperature of at least 20° C. A first reactant gas is flowed into the etch chamber 249 (step 508). In this example, the first reactant gas is Sebacoyl chloride. A pressure of 20 mTorr to 100 mTorr is provided. After 5 seconds, the flow of the first reactant gas is stopped (step 512). FIG. 6 is a more detailed flow chart of the depositing the second reactant (step 120). The stack 203 is heated (step 604). In this embodiment, the stack 203 is heated while remaining in the etch chamber 249. The ESC temperature controller may heat the ESC 208 to maintain the stack 203 at a temperature of at least 20° C. A second reactant gas is flowed into the etch chamber 249 (step 608). In this example, the second reactant gas is 1,3-pentadiamine. A pressure of 20 mTorr to 100 mTorr is provided. After 5 seconds, the flow of the second reactant gas is stopped (step 612). The process is continued for a plurality of cycles. In this example, the cycles are a plasmaless process. FIG. 4D is a cross sectional view of a stack 203 after a plurality of multiple layers 424 is deposited (step 112) to provide a protective film. The plurality of multiple layers 424 is not drawn to scale.

The multiple layers 424 are then cured (step 124). An example recipe for curing the multiple layers is low power Ne plasma.

Figure 4E:
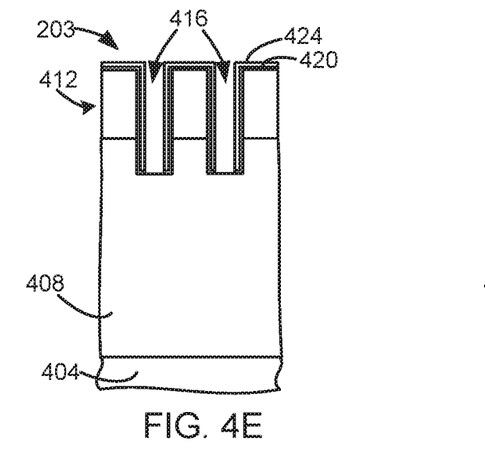

A breakthrough is provided (step 128). An example recipe for providing the breakthrough comprises use of a typical etch process, such as the etch process specified below to partially etch the etch layer 408, with additional 10 sccm of $O_2$ to increase polymer removal capability. FIG. 4E is a cross sectional view of a stack 203 after a the breakthrough is completed.

Figure 4F:
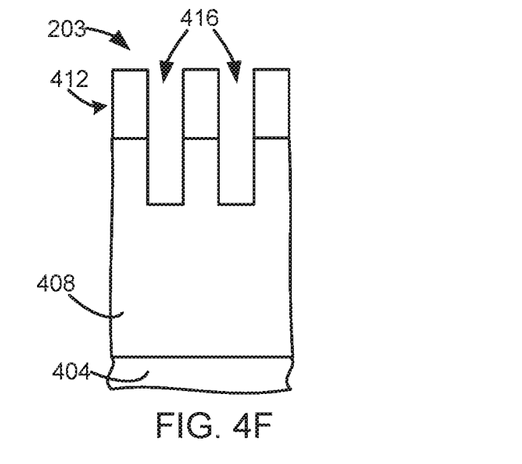

The etch layer 408 is at least partially etched (step 132). In this embodiment, the stack 203 is cooled while remaining in the etch chamber 249. The chiller 214 cools a coolant to a temperature below −20° C. The coolant is used to cool the stack 203. An example of a recipe for partially etching features into the etch layer 408 provides a pressure of 5-50 mT. RF power is provided at a frequency of 60 MHz at a power of 2 kW-8 kW and at a frequency of 400 k at a power of 4 kW-25 kW. The RF power is pulsed between these powers and lower power levels. An etch gas is provided, which comprises $O_2$, fluorocarbon(s) and/or hydrofluorocarbon(s). FIG. 4F is a cross sectional view of a stack 203 after features 416 have been partially etched. In this example, the priming layer 420 and multiple layers 424 (shown in FIG. 4E) have been removed during the etch (step 132).

Figure 4G:
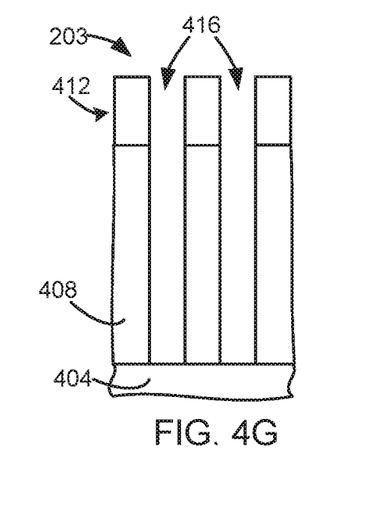

Since the etch is not completed, the process is repeated (step 136) beginning at the priming the features (step 108). The steps are repeated until the etching of the features is completed (step 136) when the etching the features has reached a final depth. FIG. 4G is a cross sectional view of the stack 203 after the completion of the etching of the features 416.

In this embodiment, during the etching of the features, a coolant at less than −20° C. is used to cool the stack 203, so to provide an improved etch. In this embodiment, the lower temperature processes and higher temperature processes are performed in the same etch chamber. In other embodiments, lower temperature processes may be performed in different process chambers than higher temperature processes. In other embodiments, the etching of the features is performed at about the same temperature as other processes.

In this embodiment, the features are primed (step 108) before the multiple layer deposition. The priming of the features (step 108) modifies the sidewall surface to better facilitate the multiple layer deposition (step 112). In some embodiments, the priming step (step 108) is designed to functionalize the feature sidewall to promote reactions with the atomic layer deposition (ALD) precursors, which are provided in the next step. Various embodiments include: 1) a short low bias plasma oxidizing plasma to remove some sidewall etch residues formed from an oxidizing gas of at least one of $O_2$, nitrogen ($N_2$), $CO_2$, nitrogen trifluoride ($NF_3$), sulfur hexafluoride ($SF_6$), water ($H_2O$), and/or carbonyl sulfide (COS) 2) a short low power reducing plasma to remove some sidewall etch residue and/or introduce hydroxide (—OH) and/or amide (—$NH_2$) surface groups, formed from a reducing gas of at least one of hydrogen ($H_2$), a mixture of nitrogen ($N_2$)+$H_2$, hydrazine ($N_2H_4$), and/or ammonia ($NH_3$). 3) a non-plasma vapor treatment to functionalize the surface, which could include $H_2O$, $NH_3$, $O_3$, $N_2H_4$, and/or peroxide ($H_2O_2$) as reactive vapors. For some ALD processes, a several ALD cycles are needed before a layer is actually deposited. The addition of a priming step may result in less ALD cycles being needed to before a layer is actually deposited. In addition, the priming step may make the process more repeatable, provide a more uniform film, and provide more consistent deposition between different wafers. In other embodiments, the features are not primed.

In this embodiment, the two reactants comprise carbon, hydrogen, oxygen, and nitrogen to provide an etch resistant sidewall passivation. In other embodiments, one of the two reactants may comprise at least one of a metal, sulfur, boron, silicon, nitrogen, or phosphorous. In some embodiments, one of the two reactants comprises a metal, which is at least one of aluminum (Al), titanium (Ti), tungsten (W), tantalum (Ta), hafnium (Hf), or ruthenium (Ru). Although the overall metallic content of the resulting plurality of multiple layers 424 may be fairly low, it is expected this metallic content will significantly reduce the lateral removal rate of the passivation in the subsequent breakthrough (step 128) and etch (step 132). Incorporation of these species may reduce the lateral removal rate of the passivation in the subsequent etch (step 132), due to the low removal rate of the added elements and/or the lower removal rate of a cross-linked polymer. In particular, 1) boron (B) and silicon (Si) are known to have lower removal rates than polymer; 2) sulfur (S) is known to induce polymer cross-linking (vulcanization), especially after plasma exposure; and 3) nitrogen (N) functionality is known to reduce polymer removal rates. In particular, metallic elements tend to have low removal rates under typical high aspect ratio etch conditions, especially fluorocarbon based etches for stacks containing $SiO_2$.

In other embodiments, the two reactants do not comprise at least one of a metal, sulfur, boron, silicon, nitrogen, or phosphorous, when such an increased passivation is not desired. In other embodiments, specific organic structural groups are incorporated into the organic precursor(s), including branched structures, rings, phenolic groups, polycyclic aromatic groups, carbon double bonds, or carbon triple bonds. Incorporation of these species may reduce the lateral removal rate of the passivation in the subsequent etch, due to 1) steric effects of these structures to impede etch radical transport; 2) increased likelihood of polymeric cross-linking after deposition; and/or 3) formation of polymer cross-linking upon plasma exposure. For example, a precursor containing carbon double bonds may create a surface film which is crosslinked upon activation by ultra violet (UV) radiation from the plasma.

In other embodiments, one or more polydentate precursors are used instead of the more conventional bidentate precursors which are the basis of ALD. Polydentate means the precursor has 3 or more head groups which can react with the head groups of the other precursor. Upon reaction, these precursors will create branched chains. Therefore, these polydentate precursors should promote formation of cross-linked networks in the resulting polymer, which may reduce the lateral removal rate of the passivation in the subsequent etch. Various embodiments rely entirely on tailoring the chemical precursors to control the etch resistance of passivation films.

In this embodiment, the deposited multiple layers are cured (step 124). Curing the deposited multiple layers (step 124) make the deposited multiple layers more etch resistant. In various embodiments, the curing (step 124) may be by thermal heating, light irradiation, which may be visible, UV, or infrared irradiation, or may be by exposure to a curing plasma. A post-deposition cure may also add value by converting the sidewall passivation into a more etch resistant form. In particular, the cure step may increase cross-linking in the sidewall polymer and/or remove some hydrogen content to increase the graphitic or carbidic nature of the material. The curing may also densify the deposited plurality of multiple layers 424. A plasma in one embodiment uses a low bias plasma, which includes He, Ne, Ar, Kr, Xe, $H_2$, and/or $N_2$ gas. In this context, a low bias plasma has a DC sheath voltage of 25-750 volts. More specifically, a low bias has a DC sheath voltage of 50-400 volts. Additionally, these cures may be more effective at cross-linking, if combined with specific functionality designed into the sidewall passivation, including but not limited to: S groups, carbon (C) double bonds, phenyl groups, polycyclic aromatic groups, and/or epoxides. In other embodiments, the curing may occur after every single ALD cycle. Other embodiments may provide a curing process after a few ALD cycles. These various methods to convert the sidewall passivation into a more etch resistant material will increase the ability of the layer to protect the underlying material, thus improving the overall effectiveness of the passivation layer in producing an etch result with low bowing. In other embodiments, a curing process may not be used.

In this embodiment, a breakthrough process (step 128) is provided. Deposition of sidewall passivation can have undesirable effects, including reduced neck size and/or deposition of passivation material at the etch front. Smaller necks can interfere with the subsequent etch, by reducing flux of species and/or by causing formation of a capping layer over some fraction of the holes. Passivation at the etch front may prevent subsequent etching in some or all of the holes. To avoid these "etch stop" issues and to create a safer margin for the effectiveness of the etch, a breakthrough process can be introduced after deposition. This breakthrough process removes the deposited passivation at the neck and/or etch front, while substantially preserving the sidewall passivation film. The net outcome is to avoid risk of "etch stop", providing a wider safe operating window for the overall process. Some embodiments include additional $O_2$ or $N_2$ in a standard etch recipe to increase the capability to etch polymer. Other embodiments reduce the flow of some or all carbon-containing gases in a standard etch recipe, to shift the process towards less passivation. Other embodiments use non-halogen containing plasma comprising $O_2$ and/or $N_2$. In these various embodiments, the breakthrough process is used until the excessive neck and/or etch front passivation is removed, and then the conventional etch process can resume. In other embodiments, a breakthrough process is not provided.

In this embodiment, the partially etching the features (step 104) and etching the etch layer (step 132) are performed at cryogenic temperatures, while the depositing of the multiple layers (step 112) is done at non-cryogenic temperatures. In this embodiment, both processes are performed in the same chamber. In another embodiment, the partially etching the features (step 104) and etching the etch layer (step 132) are performed in one or more chambers at cryogenic temperatures and the depositing of the multiple layers (step 112) is done in one or more chambers at non-cryogenic temperatures. Etching at cryogenic temperatures can improve overall etch performance by increasing the etch rate and/or by increasing the selectivity of the etch to the mask. Depositing multiple layers of passivation may be more effective at non-cryogenic temperature, by avoiding the risks of excessive deposition in the cryogenic regime. In other embodiments, all steps are performed at non-cryogenic temperatures. Cryogenic temperatures are temperatures where a coolant is cooled to a temperature no greater than −20° C.

While this disclosure has been described in terms of several exemplary embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method of forming a feature in a stack comprising a dielectric material on a substrate, the method comprising:
    (a) generating an etch plasma from an etch gas, exposing the stack to the etch plasma, and partially etching the feature in the stack;
    (b) after (a), priming the stack;
    (c) depositing a protective film on sidewalls of the feature by
        (i) exposing the stack to a first reactant and allowing the first reactant to adsorb onto the stack,
        (ii) exposing the stack to a second reactant, wherein the first and second reactants react with one another to form the protective film over the stack, and
        (iii) repeating (i) and (ii) in a cyclic manner a plurality of times; and
    (d) repeating (a)-(c) until the feature is etched to a final depth, wherein the generating the etch plasma is performed while cooling the substrate to a temperature below −20° C., and wherein the depositing the protective film is performed while heating the substrate to a temperature above 20° C.

2. The method, as recited in claim 1, wherein the priming the stack modifies surfaces of the sidewalls to better facilitate the depositing the protective film.

3. The method, as recited in claim 2, wherein the priming the stack comprises at least one of an oxidizing plasma to remove some sidewall etch residue, a reducing plasma to remove some sidewall etch residue, or a non-plasma vapor treatment to functionalize a surface of the stack.

4. The method, as recited in claim 1, wherein the priming the stack comprises providing an oxidizing plasma, comprising:
    providing an oxidizing gas comprising at least one of $O_2$, $N_2$, $CO_2$, $NF_3$, $SF_6$, $H_2O$, and COS; and
    forming a plasma from the oxidizing gas.

5. The method, as recited in claim 1, wherein the priming the stack comprises providing a reducing plasma, comprising:
    providing a reducing gas comprising at least one of $H_2$, a mixture of $N_2+H_2$, $N_2H_4$, and $NH_3$; and
    forming a plasma from the reducing gas.

6. The method, as recited in claim 1, wherein the priming the stack comprises providing a non-plasma vapor treatment to functionalize a surface of the stack, comprising exposing the surface of the stack to a vapor of at least one of $H_2O$, $NH_3$, $O_3$, $N_2H_4$, or $H_2O_2$.

7. The method, as recited in claim 1, further comprising curing the protective film, wherein the curing the protective film is effected by at least one of visible or UV light irradiation, infrared irradiation, or exposure to a curing plasma.

8. The method, as recited in claim 1, wherein the protective film comprises at least one of a metal, sulfur, boron, silicon, nitrogen, or phosphorous.

9. The method, as recited in claim 1, further comprising performing a breakthrough etch to etch the protective film at neck locations.

10. A method of forming a feature in a stack comprising a dielectric material on a substrate, the method comprising:
    (a) generating an etch plasma from an etch gas, exposing the stack to the etch plasma, and partially etching the feature in the stack;
    (b) after (a), depositing a protective film on sidewalls of the feature by
        (i) exposing the stack to a first reactant and allowing the first reactant to adsorb onto the stack,
        (ii) exposing the stack to a second reactant, wherein the first and second reactants react with one another to form the protective film over the stack, and
        (iii) repeating (i) and (ii) in a cyclic manner a plurality of times;
    (c) curing the protective film; and
    (d) repeating (a)-(c) until the feature is etched to a final depth, wherein the generating the etch plasma is performed while cooling the substrate to a temperature below −20° C., and wherein the depositing the protective film is performed while heating the substrate to a temperature above 20° C.

11. The method, as recited in claim 10, wherein the curing the protective film is effected by at least one of visible or UV light irradiation, infrared irradiation, or exposure to a curing plasma.

12. The method, as recited in claim 10, wherein the curing the protective film creates cross-links in a polymer forming the protective film.

13. The method, as recited in claim 10, wherein the curing the protective film removes some hydrogen content of the protective film to increase the graphitic or carbidic nature of the protective film.

14. The method, as recited in claim 10, wherein the curing the protective film densifies the protective film.

15. The method, as recited in claim 10, wherein the curing the protective film is a step in each cycle of the depositing the protective film.

16. The method, as recited in claim 10, wherein the protective film comprises at least one of a metal, sulfur, boron, silicon, nitrogen, or phosphorous.

17. The method, as recited in claim 10, further comprising performing a breakthrough etch to etch the protective film at neck locations.

18. A method of forming a feature in a stack comprising a dielectric material on a substrate, the method comprising:
    (a) generating an etch plasma from an etch gas, exposing the stack to the etch plasma, and partially etching the feature in the stack;
    (b) after (a), depositing a protective film on sidewalls of the feature by
        (i) exposing the stack to a first reactant and allowing the first reactant to adsorb onto the stack,
        (ii) exposing the stack to a second reactant, wherein the first and second reactants react with one another to form the protective film over the stack, wherein the protective film comprises at least one of a sulfur, boron, silicon, nitrogen, or phosphorous, and
        (iii) repeating (i) and (ii) in a cyclic manner a plurality of times; and
    (c) repeating (a)-(b) until the feature is etched to a final depth, wherein the generating the etch plasma is performed while cooling the substrate to a temperature below −20° C., and wherein the depositing the protective film is performed while heating the substrate to a temperature above 20° C.

19. The method, as recited in claim 18, wherein the protective film further comprises at least one of aluminum (Al), titanium (Ti), tungsten (W), tantalum (Ta), hafnium (Hf), or ruthenium (Ru).

20. The method, as recited in claim 18, further comprising performing a breakthrough etch to etch the protective film at neck locations.

21. A method of forming a feature in a stack comprising a dielectric material on a substrate, the method comprising:
    (a) generating an etch plasma from an etch gas, exposing the stack to the etch plasma, and partially etching the feature in the stack;
    (b) after (a), depositing a protective film on sidewalls of the feature by
        (i) exposing the stack to a first reactant and allowing the first reactant to adsorb onto the stack,
        (ii) exposing the stack to a second reactant, wherein the first and second reactants react with one another to form the protective film over the stack, and
        (iii) repeating (i) and (ii) in a cyclic manner a plurality of times;
    (c) performing a breakthrough etch to etch the protective film at neck locations; and
    (d) repeating (a)-(c) until the feature is etched to a final depth, wherein the generating the etch plasma is performed while cooling the substrate to a temperature below −20° C., and wherein the depositing the protective film is performed while heating the substrate to a temperature above 20° C.

22. The method, as recited in claim 21, wherein the performing the breakthrough etch comprises exposing the stack to a plasma comprising oxygen.

23. The method, as recited in claim 21, wherein the performing the breakthrough etch completely removes the protective film on the etch fronts without completely removing the protective film on the sidewalls of the feature.

24. A method of forming a feature in a stack comprising a dielectric material on a substrate, the method comprising:
    (a) generating an etch plasma from an etch gas, exposing the stack to the etch plasma, and partially etching the feature in the stack, while cooling the substrate to a temperature below −20° C.;
    (b) after (a), depositing a protective film on sidewalls of the feature at a temperature of at least 20° C. by
        (i) exposing the stack to a first reactant and allowing the first reactant to adsorb onto the stack,
        (ii) exposing the stack to a second reactant, wherein the first and second reactants react with one another to form the protective film over the stack, and
        (iii) repeating (i) and (ii) in a cyclic manner a plurality of times; and
    (c) repeating (a)-(b) until the feature is etched to a final depth.

25. The method, as recited in claim 24, wherein the etch gas comprises $H_2$ and at least one of a fluorocarbon or hydrofluorocarbon.

26. A method of forming a feature in a stack comprising a dielectric material on a substrate, the method comprising:

(a) generating an etch plasma from an etch gas, exposing the stack to the etch plasma, and partially etching the feature in the stack, wherein the generating the etch plasma is performed while cooling the substrate to a temperature below −20° C.;
(b) after (a), depositing a protective film on sidewalls of the feature by
   (i) exposing the stack to a first reactant and allowing the first reactant to adsorb onto the stack,
   (ii) exposing the stack to a second reactant, wherein the first and second reactants react with one another to form the protective film over the stack, wherein the protective film comprises at least one of a sulfur, boron, silicon, nitrogen, or phosphorous, and
   (iii) repeating (i) and (ii) in a cyclic manner a plurality of times; and
(c) repeating (a)-(b) until the feature is etched to a final depth.

27. A method of forming a feature in a stack comprising a dielectric material on a substrate, the method comprising:

(a) generating an etch plasma from an etch gas, exposing the stack to the etch plasma, and partially etching the feature in the stack, wherein the generating the etch plasma is performed while cooling the substrate to a cryogenic temperature below −20° C.;
(b) after (a), depositing a protective film on sidewalls of the feature by
   (i) exposing the stack to a first reactant and allowing the first reactant to adsorb onto the stack,
   (ii) exposing the stack to a second reactant, wherein the first and second reactants react with one another to form the protective film over the stack, wherein the protective film comprises at least one of a sulfur, boron, silicon, nitrogen, or phosphorous, and
   (iii) repeating (i) and (ii) in a cyclic manner a plurality of times; and
(c) repeating (a)-(b) until the feature is etched to a final depth, wherein the depositing the protective film is performed while heating the substrate to a non-cryogenic temperature.

* * * * *